(12) United States Patent
Li et al.

(10) Patent No.: US 9,734,912 B2
(45) Date of Patent: Aug. 15, 2017

(54) REPROGRAMMING SINGLE BIT MEMORY CELLS WITHOUT INTERVENING ERASURE

(71) Applicant: MACRONIX INTERNATIONAL CO., LTD., Hsinchu (TW)

(72) Inventors: Yung-Chun Li, Hsinchu (TW); Yu-Ming Chang, Hsinchu (TW); Ping-Hsien Lin, Hsinchu (TW); Hsiang-Pang Li, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 15/208,175

(22) Filed: Jul. 12, 2016

(65) Prior Publication Data

US 2017/0148526 A1 May 25, 2017

Related U.S. Application Data

(60) Provisional application No. 62/259,660, filed on Nov. 25, 2015.

(51) Int. Cl.
*G11C 16/10* (2006.01)
*G11C 16/34* (2006.01)
(Continued)

(52) U.S. Cl.
CPC .......... *G11C 16/10* (2013.01); *G11C 11/5628* (2013.01); *G11C 11/5635* (2013.01);
(Continued)

(58) Field of Classification Search
CPC ................ G11C 16/3459; G11C 16/26; G11C 16/3445; G11C 16/08; G11C 16/0466;
(Continued)

(56) References Cited

U.S. PATENT DOCUMENTS

| 8,503,213 B2 | 8/2013 | Chen et al. |
| 8,508,990 B2 * | 8/2013 | Cho ..................... G11C 11/5628 365/185.03 |

(Continued)

OTHER PUBLICATIONS

Suh et al., "A 3.3 V 32 Mb NAND Flash Memory with Incremental Step Pulse Programming Scheme," Solid-State Circuits Conference, 1995. Digest of Technical Papers. 41st ISSCC, Feb. 15-17, 1995 IEEE International, pp. 128-129 and 350.

*Primary Examiner* — Harry W Byrne
*Assistant Examiner* — Ajay Ojha
(74) *Attorney, Agent, or Firm* — Yiding Wu; Haynes Beffel & Wolfeld LLP

(57) ABSTRACT

A method to operate a single bit per cell memory comprises erasing a group of memory cells establishing a first logical value by setting threshold voltages in a first range of threshold voltages. First writing, after said erasing, includes programming first selected memory cells to establish a second logical value by setting threshold voltages in a second range of threshold voltages, and saving a sensing state parameter to indicate a first read voltage. Second writing, after said first writing, includes programming second selected memory cells to establish the second logical value by setting threshold voltages in a third range of threshold voltages, and saving the sensing state parameter to indicate a second read voltage. After a number of writings including said first writing and said second writing reaches a threshold number for writing the group of memory cells, the group of memory cells can be erased.

19 Claims, 9 Drawing Sheets

(51) Int. Cl.
*G11C 11/56* (2006.01)
*G11C 16/16* (2006.01)
*G11C 16/26* (2006.01)
*G11C 16/08* (2006.01)
*G11C 16/04* (2006.01)

(52) U.S. Cl.
CPC ...... *G11C 11/5642* (2013.01); *G11C 16/0466* (2013.01); *G11C 16/08* (2013.01); *G11C 16/16* (2013.01); *G11C 16/26* (2013.01); *G11C 16/3445* (2013.01); *G11C 16/3459* (2013.01)

(58) Field of Classification Search
CPC . G11C 16/16; G11C 11/5642; G11C 11/5628; G11C 11/5635; G11C 16/10
See application file for complete search history.

(56) References Cited

U.S. PATENT DOCUMENTS

| | | |
|---|---|---|
| 2002/0057599 A1 | 5/2002 | Miyawaki et al. |
| 2003/0147279 A1 | 8/2003 | Pan et al. |
| 2007/0171729 A1 | 7/2007 | Aritome |
| 2008/0259684 A1 | 10/2008 | Shlick et al. |
| 2010/0103735 A1 | 4/2010 | Kim et al. |
| 2010/0205352 A1 | 8/2010 | Chu et al. |
| 2010/0226174 A1 | 9/2010 | Kim et al. |
| 2011/0149657 A1 | 6/2011 | Haratsch et al. |
| 2013/0051149 A1* | 2/2013 | Cerafogli ............ G11C 11/5628 365/185.18 |
| 2013/0265830 A1* | 10/2013 | Bisen ................. G11C 11/5628 365/185.29 |
| 2014/0153340 A1 | 6/2014 | Baek |
| 2014/0198570 A1 | 7/2014 | Hsieh et al. |
| 2014/0219020 A1* | 8/2014 | Kwak ................... G11C 16/10 365/185.03 |
| 2014/0293699 A1* | 10/2014 | Yang ................... G11C 11/5628 365/185.17 |
| 2015/0092493 A1 | 4/2015 | Costa et al. |
| 2015/0325298 A1* | 11/2015 | D'Abreu ............... G11C 16/10 365/185.09 |

* cited by examiner

Fig. 2 - Prior Art

Fig. 3: Full Program Voltage Range

Fig. 4: Adaptive Program Voltage Range

Fig. 5: Variable Vt Range

Fig. 6: Parallel Shift

US 9,734,912 B2

REPROGRAMMING SINGLE BIT MEMORY CELLS WITHOUT INTERVENING ERASURE

PRIORITY CLAIM

This application claims the benefit of U.S. Provisional Patent Application No. 62/259,660, filed 25 Nov. 2015 entitled Rewritable Programming Designs on SLC Flash Memory. This application is incorporated herein by reference.

BACKGROUND

Field of the Invention

The present invention relates to high density memory devices, and particularly the operation of flash memory devices.

Description of Related Art

Memory technologies used for integrated circuit memories are being developed at smaller and smaller technology nodes, and are being deployed on larger and larger memory arrays on a single integrated circuit. Technologies being pursued include multiple layers of memory cells on a single chip. Operations performed on a 3D (three-dimensional) flash memory having multiple layers of memory cells include read, write and erase.

A flash memory is usually configured so that it can be erased a block at a time by a block erase. When a block is erased, memory cells in the block are set to one logic value, such as "1". After a block is erased, memory cells in the block can be programmed to a different value, such as "0". Once a memory cell is programmed to "0", the memory cell can be changed back to "1" by a block erase of the block including the programmed memory cell. Once some memory cells in a block, such as cells in a selected byte or word in the block, are programmed to "0" during a first program operation, other memory cells in a different byte or word in the same block that are known to be in the erased state, can still be programmed to "0" during a second program operation without requiring a pre-erase of the block.

However, a general issue of high density flash memories is that the size of a block of memory cells is often very large. This is not convenient if a pre-erase of the block is required every time a single memory cell in the block that has been programmed to "0" needs to be changed back to "1". As the density of flash memories increases, the number of layers in the stacks increase, leading to larger block sizes and further inconvenience in erase operations.

Thus, it is desirable to provide for a technology that allows multiple write operations to change a same memory cell from one logic value to a different logic value and vice versa after each erase operation.

SUMMARY

A method is provided to operate a single bit per cell memory, comprising applying a one-erase, multiple-write programming operation. A memory cell can have a large enough full threshold voltage range to be used as a multiple level memory cell (MLC). When such a memory cell is used as a single bit per cell memory cell, after an erase operation, the memory cell can be programmed multiple times, and each time only a partial and incrementally higher range of the full threshold voltage range is used, until a last writing operation reaches the maximum of the full threshold voltage range and another erase operation is needed. Using this operating method, the number of block erase operations required can be reduced, improving operating speed because block erase operations are slow, and improving endurance because the number of erase cycles is reduced. Variants of the one-erase, multiple-write programming operation can be adopted for a variety of memory cell types, memory architectures, programming speeds, and data storage densities.

A method is provided for example to operate a single bit per cell memory. A group of memory cells is erased establishing a first logical value in the memory cells of the group by setting threshold voltages in a first range of threshold voltages. After the group of memory cells is erased, the sensing state parameter can be set to indicate the first read voltage to sense the cell logical value.

A first writing operation, after the group of memory cells is erased, includes programming first selected memory cells in the group to establish a second logical value by setting threshold voltages in a second range of threshold voltages. The second range of threshold voltages is different than the first range of threshold voltages. A sensing state parameter is saved to indicate a first read voltage to sense a cell logical value, where the first read voltage can be between the first range and the second range of threshold voltages.

A second writing operation, after the first writing operation, includes programming second selected memory cells in the group to establish the second logical value by setting threshold voltages in a third range of threshold voltages. The third range of threshold voltages is different than the first and second ranges of threshold voltages. The sensing state parameter is saved to indicate a second read voltage to sense the cell logical value, where the second read voltage can be between the second range and the third range of threshold voltages. A range of threshold voltages which represents the first logical value after the second writing operation can overlap with the second range of threshold voltages.

Further writing operations can be executed in a fashion similar to the first and second writing operations on the group of memory cells. After a number of writing operations including the first and second writing operations reaches a threshold number for writing the group of memory cells, the group of memory cells can be erased, and sensing state can be set to set the cell logical value using the first read voltage between the first range and the second range of threshold voltages, for the group of memory cells.

The first writing operation includes programming using a first program verify voltage between the first range and the second range of threshold voltages and higher than the first read voltage to set threshold voltages in the second range of threshold voltages. The second writing operation includes programming using a second program verify voltage between the second range and the third range of threshold voltages and higher than the second read voltage to set threshold voltages in the third range of threshold voltages. The second program verify voltage has a higher voltage magnitude than the first program verify voltage.

The method includes applying program pulses and respective program verify pulses following the program pulses in a pulse program sequence which incrementally increases program voltages of the program pulses for programming the memory cells in the group. In one embodiment, the pulse program sequence for the second writing operation has more pulse steps than the pulse program sequence for the first writing operation. In another embodiment, the pulse program sequence is started at a higher program voltage for the second writing operation than for the first writing operation. In yet another embodiment, a larger voltage step is used in the second writing operation than in the first writing operation for incrementally increasing the program voltages of program pulses in the pulse program sequence.

In one embodiment, the third range of threshold voltages for the second writing operation has a width different than that of the second range of threshold voltages for the first writing operation. In another embodiment, a range of threshold voltages which represents the first logical value after the second writing operation has a width greater than the first range of threshold voltages.

In one embodiment, the second writing operation includes programming memory cells in the group having threshold voltages in the first range of threshold voltages to set their threshold voltages in the second range of threshold voltages, and then programming the second selected cells to set their threshold voltages in the third range of threshold voltages.

When reading the memory cells in the group memory cells that have been programmed using the one-erase, multiple-write programming operation as described herein, a read voltage is determined in response to the saved sensing state parameter for the group of memory cells.

A rewrite count for the group of memory cells can be incremented, in response to a request to write the group of memory cells. If the rewrite count reaches a rewrite threshold for the group of memory cells, the group of memory cells is erased, the rewrite count for the group of memory cells is reset, and subsequently the group of memory cells is written. If the rewrite count is below the rewrite threshold, then the group of memory cells is written, without erasing the group of memory cells and without resetting the rewrite count for the group of memory cells.

Furthermore, a sensing state parameter for the group of memory cells can be saved in a sensing state parameter table in the memory to indicate a read voltage at which to sense a cell logical value for the memory cells in the group. A sensing state parameter can also be saved in a sensing state parameter table in a controller controlling and external to the memory, and/or in a host system coupled to a controller controlling and external to the memory, to indicate a read voltage at which to sense a cell logical value for the memory cells in the group.

Other aspects and advantages of the present invention can be seen on review of the drawings, the detailed description and the claims, which follow.

DETAILED DESCRIPTION

Figure 1:
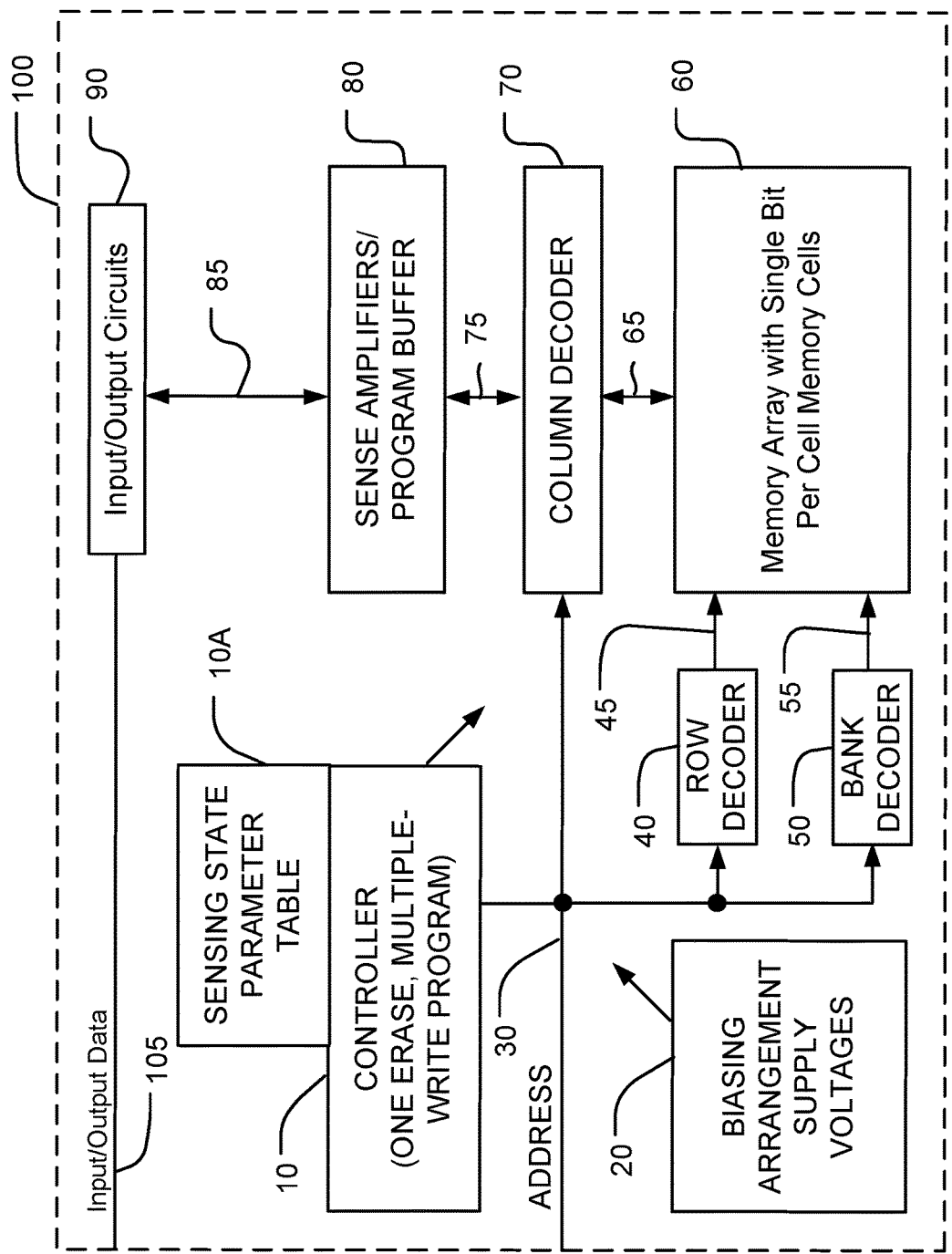
FIG. 1 is a block diagram of an integrated circuit memory employing memory cells and bias circuitry according to embodiments of the present invention configured for one-erase, multiple-write programming procedures as described herein.

A detailed description of embodiments is provided with reference to the Figures. It is to be understood that there is no intention to limit the technology to the specifically disclosed structural embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows. Like elements in various embodiments are commonly referred to with like reference numerals.

FIG. 1 is a simplified chip block diagram of an integrated circuit memory device 100 configured for one-erase, multiple-write programming operations as described herein. The integrated circuit memory device 100 includes a memory array 60 including multiple-level memory cells that store one bit of data per cell, on an integrated circuit substrate, and controller 10 that implements one-erase, multiple-write programming operations on multiple-level memory cells that store one bit of data per cell as described herein.

A row decoder 40 is coupled to a plurality of word lines 45, and arranged along rows in the memory array 60. A bank decoder 50 is coupled to a plurality of bank select lines 55 (such as SSL lines and GSL lines). A column decoder 70 is coupled to a plurality of bit lines 65 arranged along columns in the memory array 60 for reading data from and writing data to the memory array 60. Addresses are supplied on bus 30 from controller 10 to column decoder 70, and row decoder 40. A sense amplifier and program buffer circuits in block 80 are coupled to the column decoder 70, in this example via a first data lines 75. The column decoder 70 can include circuits for selectively apply program voltages to bit lines in the memory in response to the data values in the program buffer. Block 80 can include sense circuits that use the sensing state parameters for different groups of memory cells to apply the indicated read voltages, such as the first read voltage Vread1, the second read voltage Vread2, and the third read voltage Vread3 described in reference to embodiments illustrated by FIGS. 3-6.

Sensed data from the sense amplifier/program buffer circuits 80 are supplied via second data lines 85 to input/output circuits 90. Also, input data is applied via the input/output data line 105 from input/output ports on the integrated circuit memory device 100 or from other data sources internal or external to the integrated circuit memory device 100 to the input/output circuits 90 and in turn to the sense amplifiers/program buffer 80.

Input/output circuits 90 drive the data to destinations external to the integrated circuit 100. Input/output data and control signals are moved via data bus 105 between the input/output circuits 90, controller 10 and input/output ports on the integrated circuit memory device 100 or other data sources internal or external to the integrated circuit 100, such as a general purpose processor or special purpose application circuitry, or a combination of modules providing system-on-a-chip functionality supported by the memory array 60.

In the example shown in FIG. 1, control logic 10 is coupled to the memory array 60 and the voltage supply or supplies in block 20. Control logic 10 includes logic to control one-erase, multiple-write program operations described herein. Control logic 10 using a bias arrangement state machine controls the application of voltages, such as program, program verify, read, and erase voltages, generated or provided through the voltage supply or supplies in block 20. The voltage supply or supplies in block 20 generates program pulses and respective program verify pulses following the program pulses in a pulse program sequence for application to selected word lines for programming memory cells connected to the selected word lines, where the pulse program sequence incrementally increases program voltages of the program pulses.

In reference to embodiments illustrated by FIGS. 3-6, for writing operations, different program verify voltage levels (e.g. VPV1, VPV2, VPV3) are generated by the voltage supply or supplies in block 20 for the program verify pulses to set threshold voltages in ranges (e.g. 320, 330, 340) of threshold voltages to establish a second logical value (e.g. "0") in the first, second and third writing operations. The voltage supply or supplies in block 20 can start a pulse program sequence at a same program voltage for the first writing operation and the second writing operation, or start a pulse program sequence at a higher program voltage for the second writing operation than the first writing operation, depending on embodiments. The voltage supply or supplies in block 20 can incrementally increase program voltages of the program pulses in the pulse program sequence at a same voltage step for a first writing operation and a second writing operation after the first writing operation, or at a larger voltage step for the second writing operation than the second writing operation, depending on embodiments.

For reading operations, different read voltage levels (e.g. Vread1, Vread2, Vread3) are generated by the voltage supply or supplies in block 20 for read pulses to read memory cells programmed in the first, second and third writing operations.

Controller 10 can be implemented using special-purpose logic circuitry as known in the art. In alternative embodiments, the controller can comprise a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

The integrated circuit memory device (e.g. 100) comprises a group of single bit per cell memory cells (e.g. in the memory array 60), and a controller (e.g. 10) coupled to the group of single bit per cell memory cells including:

logic to establish a first logical value of the single bit in the memory cells by an erase operation setting threshold voltages in a first range of threshold voltages;

logic to set first and second logical values on the single bit by a first write operation, after executing the erase operation, including the first write operation including programming first selected memory cells in the group to establish a second logical value by setting threshold voltages in a second range of threshold voltages, the second range of threshold voltages different than the first range of threshold voltages, and saving a sensing state parameter to indicate a first read voltage;

logic to set first and second logical values on the single bit by a second write operation, after executing the first write operation, the second write operation including programming second selected memory cells in the group to establish the second logical value by setting threshold voltages in a third range of threshold voltages, the third range of threshold voltages different than the first and second ranges of threshold voltages, and saving the sensing state parameter to indicate a second read voltage;

logic to execute the erase operation after a number of times that the first and second write operations are executed reaches a threshold number for writing the group of memory cells; and logic to execute a read operation including applying a selected one of the first and second read voltages.

The logic can be extended to more than two write operations as explained in examples described below.

The sensing state parameter can be saved in an on-chip sensing state parameter table (e.g. 10A), an off-chip sensing state parameter table, or both. As shown in the example of FIG. 1, the sensing state parameter can be saved in an on-chip sensing state parameter table 10A in the integrated circuit 100, to indicate a read voltage at which to sense a cell logical value for memory cells in a group of memory cells. Controller 10 is connected to the sensing state parameter table 10A, and can access and update sensing state parameters for different groups of memory cells saved in the sensing state parameter table 10A.

Controller 10 can include logic to execute further writing operations in a fashion similar to the first and second writing operations on the group of memory cells, and logic to erase the group of memory cells after a number of writing operations including the first and second writing operations reaches a threshold number for the group or memory cells. Controller 10 can include logic to set the sensing state parameter to indicate the first read voltage to sense the cell logical value, after the group of memory cells is erased. A number of writing operations that have been executed on a group of memory cells after one erase operation can also be saved in the sensing state parameter table 10A. For instance, if the threshold number for writing a group of memory cell is 8, indicating that a group of memory cells can be rewritten eight times after one erase operation, then only three bits are required for maintaining the number of writing operations for a group, and therefore the memory overhead is very light.

The memory array 60 can comprise charge trapping memory cells configured to store a single bit per cell, by the establishment of multiple program levels that correspond to amounts of charge stored, which in turn establish memory cell threshold voltages $V_T$. In other examples, the memory cells may comprise programmable resistance memory cells, configured for a single bit per cell, by the establishment of multiple program levels that correspond to amounts of resistance. The description herein is based on the use of charge trapping memory cells, such as floating gate flash memory and dielectric charge trapping flash memory. The technology can be used with other memory cell technologies.

Figure 2:
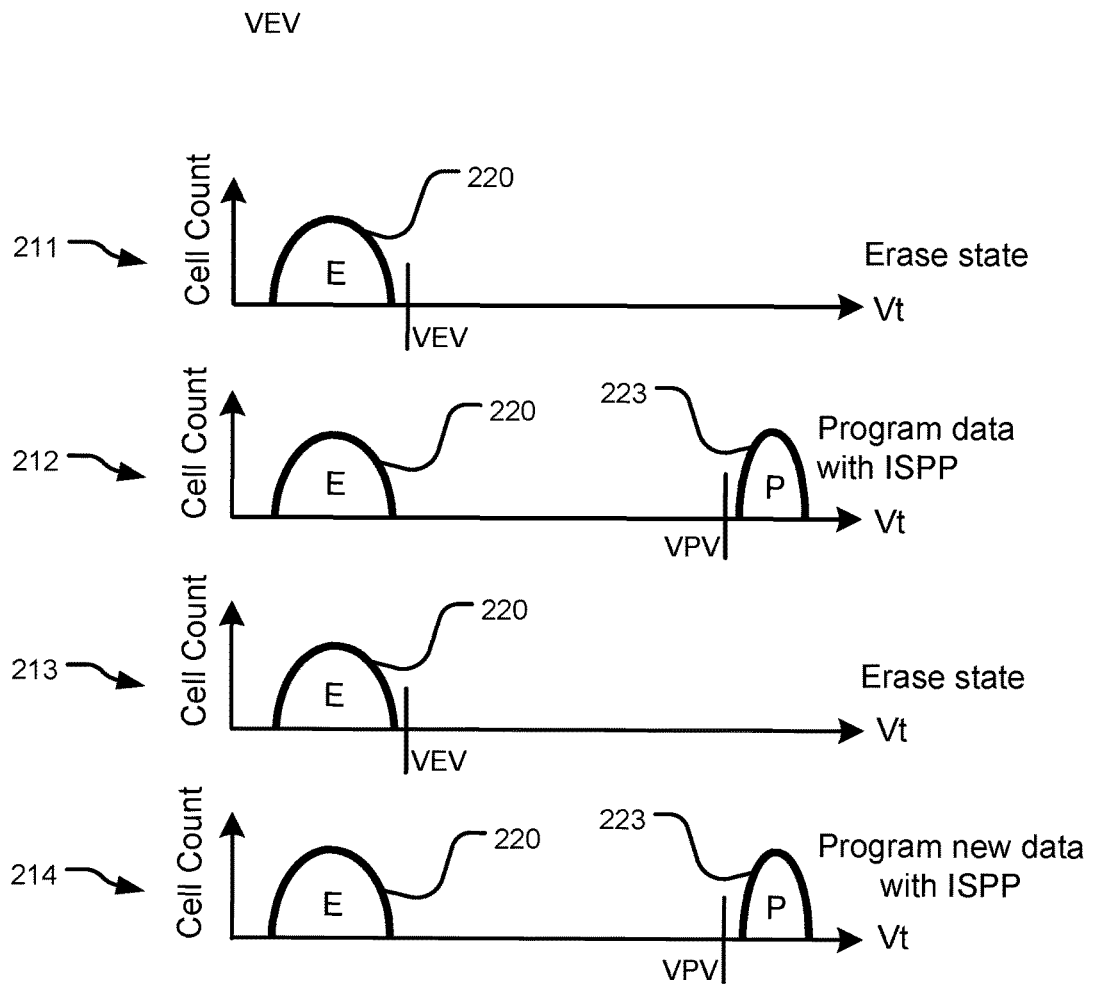
FIG. 2 illustrates a one-erase, one-write programming procedure used in prior art techniques for programming a single bit per cell memory.

FIG. 2 illustrates a one-erase, one-write programming procedure used in prior art techniques for programming a single bit per cell memory. The first line 211 represents an erase operation on a block of memory cells, setting all the memory cells in the block to a lower threshold voltage range 220. This erase operation can execute using an erase verify VEV voltage. For a memory cell having a single level, an ISPP procedure is utilized as represented by the second line 212. In the ISPP procedure, the program verify level VPV is set to establish a higher threshold range 223. Once a memory cell is programmed to the higher threshold range, the memory cell can be changed back to the lower threshold voltage range only by executing a block erase operation on the entire block. However, a general issue of high density flash memories is that the size of a block of memory cells is often very large. This is not convenient if an erase operation of the entire block is required every time a single memory cell in the block that has been programmed to "0" needs to be changed back to "1". As the density of flash memories increases, the number of layers in the stacks increase, leading to larger block sizes and further inconvenience in erase operations.

The third line 213 represents a subsequent erase operation on the block of memory cells, setting all the memory cells in the block to the lower threshold voltage range 220. This erase operation can execute using the erase verify VEV voltage. An ISPP procedure is utilized as represented by the fourth line 214. In the ISPP procedure, the program verify level VPV is set to establish a higher threshold range 223. Since the size of a block of memory cells is often very large, it is not convenient if a pre-erase of the block is required every time a single memory cell in the block that has been programmed to the higher threshold voltage range needs to be changed back to the lower threshold voltage range.

Figure 3:
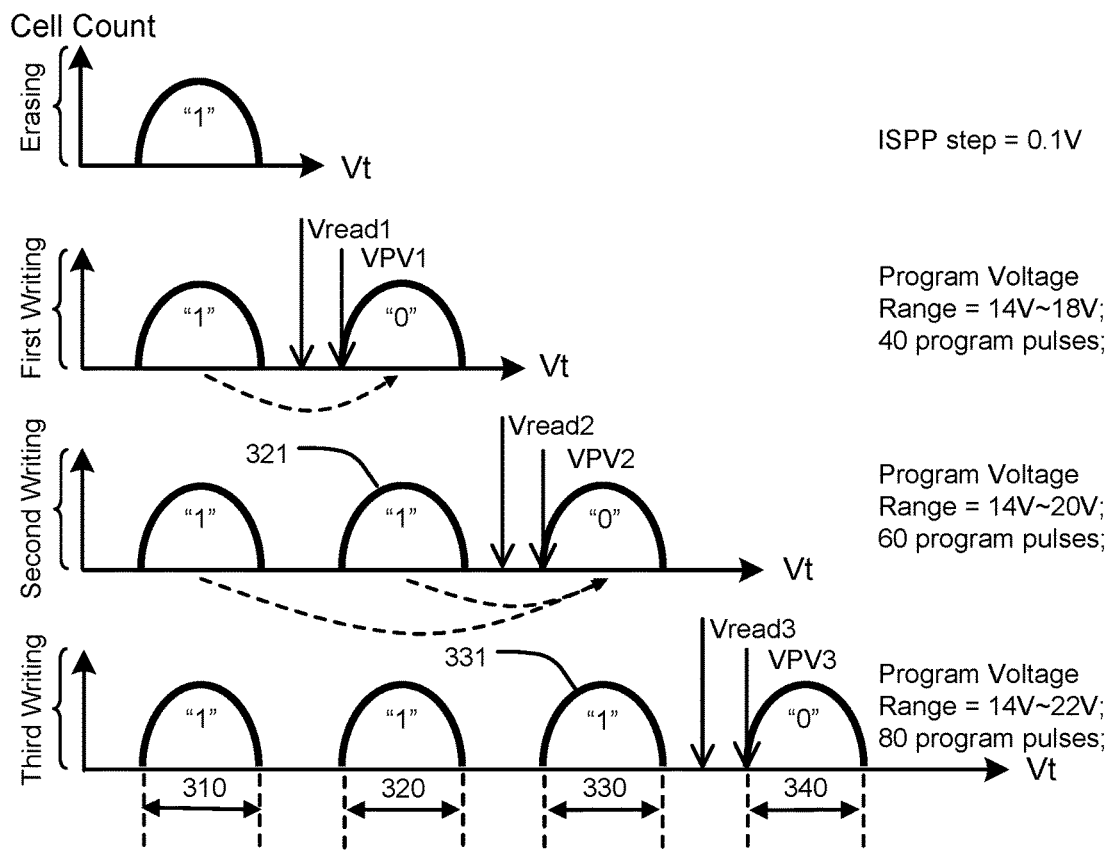
FIG. 3 illustrates a first embodiment of a one-erase, multiple-write programming procedure for programming a single bit per cell memory.

FIG. 3 illustrates a first embodiment of a one-erase, multiple-write programming procedure for programming a single bit per cell memory. The first embodiment can be referred to as a full program voltage range embodiment. This label for the embodiment does not imply any limitation on the process.

Figure 9:
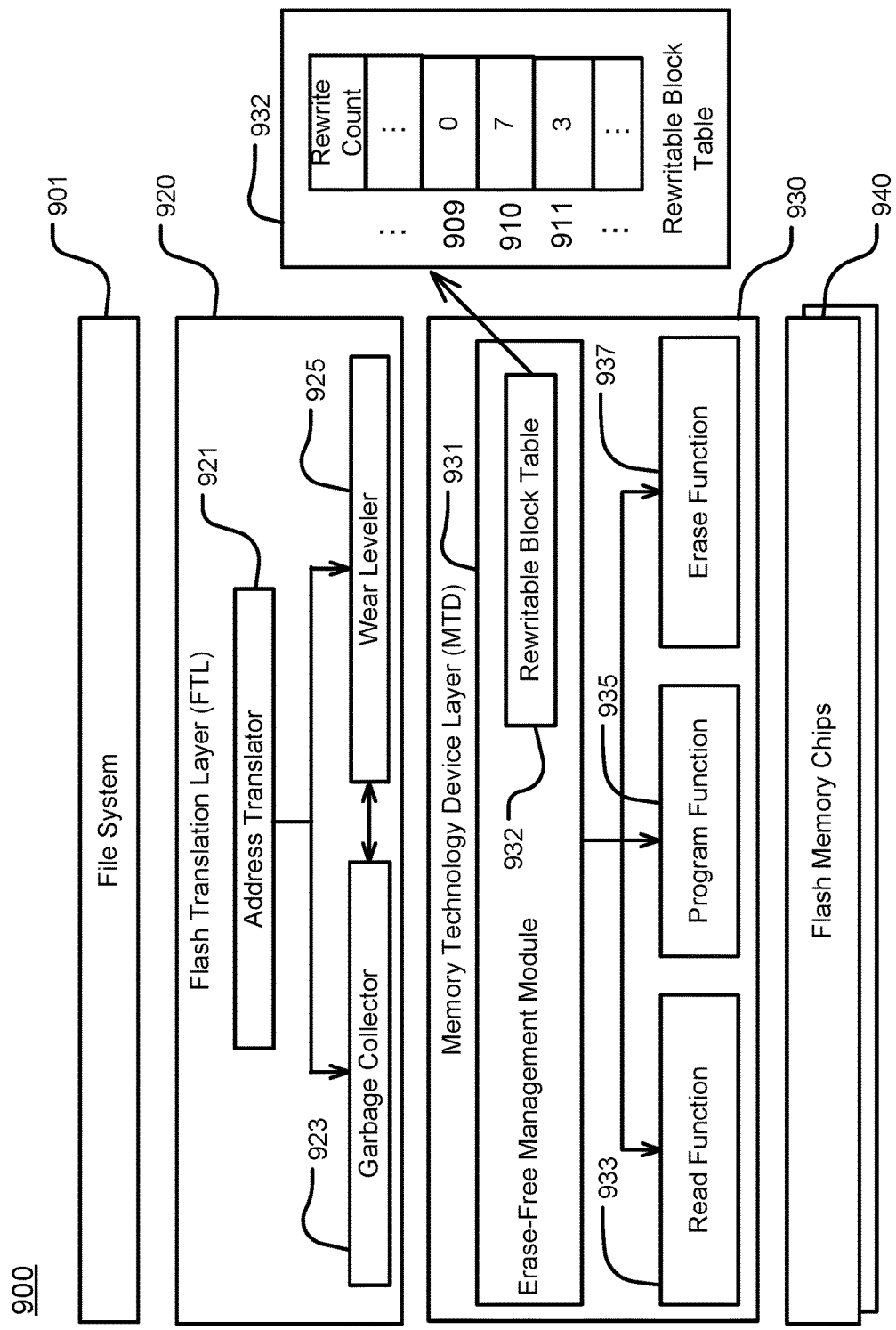
FIG. 9 is a block diagram of an example memory management system.

As seen in the top row of FIG. 3, a group of memory cells is erased establishing a first logical value (e.g. "1") in the memory cells of the group by setting threshold voltages in a first range 310 of threshold voltages. A first writing operation as seen in the second row of FIG. 3, after the group of memory cells is erased, includes programming first selected memory cells in the group to establish a second logical value ("0") by setting threshold voltages in a second range 320 of threshold voltages. The second range 320 of threshold voltages is different than the first range 310 of threshold voltages. Although as shown in FIG. 3, two adjacent ranges of threshold voltages (e.g. 310 and 320, 320 and 330, 330 and 340) are non-overlapping with each other, in actual implementations two adjacent ranges of threshold voltages may be partially overlapping depending on ranges of threshold voltages available in a particular memory device. Such overlapping between two adjacent ranges of threshold voltages can represent errors in memory cells, and read voltages (e.g. Vread1, Vread2, Vread3) can be designed to distinguish between two adjacent ranges of threshold voltages. A sensing state parameter is saved to indicate a first read voltage (e.g. Vread1) to sense a cell logical value, where the first read voltage can be between the first range 310 and the second range 320 of threshold voltages. For instance, the sensing state parameter can be saved in an on-chip sensing state parameter table 10A as described in reference to FIG. 1, and/or in the Memory Technology Device Layer (MTD) as described in reference to FIG. 9, and/or in the host system 901 (FIG. 9).

The first writing operation includes using a first program verify voltage (VPV1) between the first range 310 and the second range 320 of threshold voltages and higher than the first read voltage (Vread1) to set threshold voltages in the second range 320 of threshold voltages.

A data set can be stored in a buffer in the memory for programming a group of memory cells, such as a page of memory cells. Each memory cell in the group can maintain electrical charge that causes a plurality of ranges of threshold voltages including the first range and the second range of threshold voltages. The buffer can be the program buffer in block 80 shown in FIG. 1. The data set indicates one of the first logical value ("1") and the second logical value ("0") for each memory cell in the group. The selected memory cells are indicated for the second logical value by the data set.

A single bit memory cell can indicate logical values "1" or "0". In examples used in the present specification, the first logical value is illustrated with the logical value "1" and the second logical value is illustrated with the logical value "0". Alternatively, the first logical value can be illustrated with the logical value "0" and the second logical value can be illustrated with the logical value "1".

A second writing operation as seen in the third row of FIG. 3, after the first writing operation, includes programming second selected memory cells in the group to establish the second logical value ("0") by setting threshold voltages in a third range 330 of threshold voltages. The third range 330 of threshold voltages is different than the first and second ranges 310 and 320 of threshold voltages. The sensing state parameter is saved to indicate a second read voltage (e.g. Vread2) to sense the cell logical value, where the second read voltage can be between the second range 320 and the third range 330 of threshold voltages. The second range 320 of threshold voltages represents the first logical value (e.g. "1") after the second writing operation.

The second writing operation includes using a second program verify voltage (VPV2) between the second range 320 and the third range 330 of threshold voltages and higher than the second read voltage (Vread2) to set threshold voltages in the third range 330 of threshold voltages.

A third writing operation as seen in the fourth row of FIG. 3, after the second writing operation, including programming third selected memory cells in the group to establish the second logical value ("0") by setting threshold voltages in a fourth range 340 of threshold voltages. The fourth range 340 of threshold voltages is different than the first, second and third ranges 310, 320 and 330 of threshold voltages. The sensing state parameter is saved to indicate a third read voltage (e.g. Vread3) to sense the cell logical value, where the third read voltage can be between the third range 330 and the fourth range 340 of threshold voltages. The third range 330 of threshold voltages represents the first logical value (e.g. "1") after the third writing operation.

The third writing operation includes using a third program verify voltage (VPV3) between the third range 330 and the fourth range 340 of threshold voltages and higher than the third read voltage (Vread3) to set threshold voltages in the fourth range 340 of threshold voltages.

A range of threshold voltages (e.g. 321) which represents the first logical value ("1") after the second writing operation overlaps with the second range of threshold voltages (e.g. 320). A range of threshold voltages (e.g. 331) which represents the first logical value ("1") after the third writing operation overlaps with the third range of threshold voltages (e.g. 330).

Table 1 illustrates the first embodiment, in reference to FIG. 3, and using 5 memory cells (Cells 1-5) as an example.

TABLE 1

|  | Cell 1 | Cell 2 | Cell 3 | Cell 4 | Cell 5 |
| --- | --- | --- | --- | --- | --- |
| Erase | Erased to "1" (310) | Erased to "1" (310) | Erased to "1" (310) | Erased to "1" (310) | Erased to "1" (310) |
| $1^{st}$ Writing | "1" (310) | Write "0" (320) | Write "0" (320) | "1" (310) | "1" (310) |
| $2^{nd}$ Writing | "1" (310) | "1" (320) | Write "0" (330) | Write "0" (330) | "1" (310) |
| $3^{rd}$ Writing | "1" (310) | "1" (320) | "1" (330) | Write "0" (340) | Write "0" (340) |

As shown in the example of Table 1, after an erase operation, all 5 memory cells are set to threshold voltages in a first range 310 of threshold voltages representing a first logical value (e.g. "1").

After a first writing operation to write the logic value "0" to memory cells 2 and 3, memory cells 2 and 3 are set to threshold voltages in a second range 320 of threshold voltages (FIG. 3) representing a second logical value (e.g. "0"). Memory cells 1, 4 and 5 remain in the first range of threshold voltages representing the first logical value (e.g. "1").

After a second writing operation to write the logic value "0" to memory cells 3 and 4, memory cells 3 and 4 are set to threshold voltages in a third range 330 of threshold voltages (FIG. 3) representing the second logical value (e.g. "0"). Memory cells 1 and 5 remain in the first range of threshold voltages representing the first logical value (e.g. "1"). Memory cell 2 remains in the second range of threshold voltages representing the first logical value (e.g. "1").

After a third writing operation to write the logic value "0" to memory cells 4 and 5, memory cells 4 and 5 are set to threshold voltages in a fourth range 340 of threshold voltages (FIG. 3) representing the second logical value (e.g. "0"). Memory cells 1, 2 and 3 remain in the first, second and third ranges of threshold voltages respectively, representing the first logical value (e.g. "1").

Further writing operations can be executed in a fashion similar to the first and second writing operations on the group of memory cells, such as the third writing operation. After a number of writing operations including the first and second writing operations reaches a threshold number for writing the group of memory cells, the group of memory cells can be erased, and sensing state can be set to set the cell logical value using the first read voltage between the first range and the second range of threshold voltages, for the group of memory cells.

Writing operations described in connection with FIG. 3 include applying program pulses and respective program verify pulses following the program pulses in a pulse program sequence which incrementally increases program voltages of the program pulses for programming the memory cells in the group. The pulse program sequence can be an ISPP sequence (incremental step pulse programming). ISPP is a well-known technique described in Suh et al., "A 3.3V 32 Mb NAND Flash Memory with Incremental Step Pulse Programming Scheme," IEEE International Solid-State Circuits Conference, 1995, page 128-130. In the first embodiment shown in FIG. 3, the pulse program sequence can be started at a same program voltage (e.g. 14V) for the first writing operation, the second writing operation, and the third writing operation. Since the pulse program sequence is ended at incrementally higher program voltages, from the first writing operation to a last writing operation, the pulse program sequence for the second writing operation has more pulse steps than the pulse program sequence for the first writing operation, and the pulse program sequence for the third writing has more pulse steps than the pulse program sequence for the second writing operation. For instance, the program voltage range for the pulse program sequence can be from 14V to 18V (18V−14V=4V) for the first writing operation, from 14V to 20V (20V−14V=6V) for the second writing operation, and from 14V to 22V (22V−14V=8V) for the third writing operation. Consequently, given an ISPP step of 0.1V, the first embodiment requires up to 40, 60 and 80 program pulses to set threshold voltages in respective ranges of threshold voltages for the first, second and third writing operations.

Figure 4:
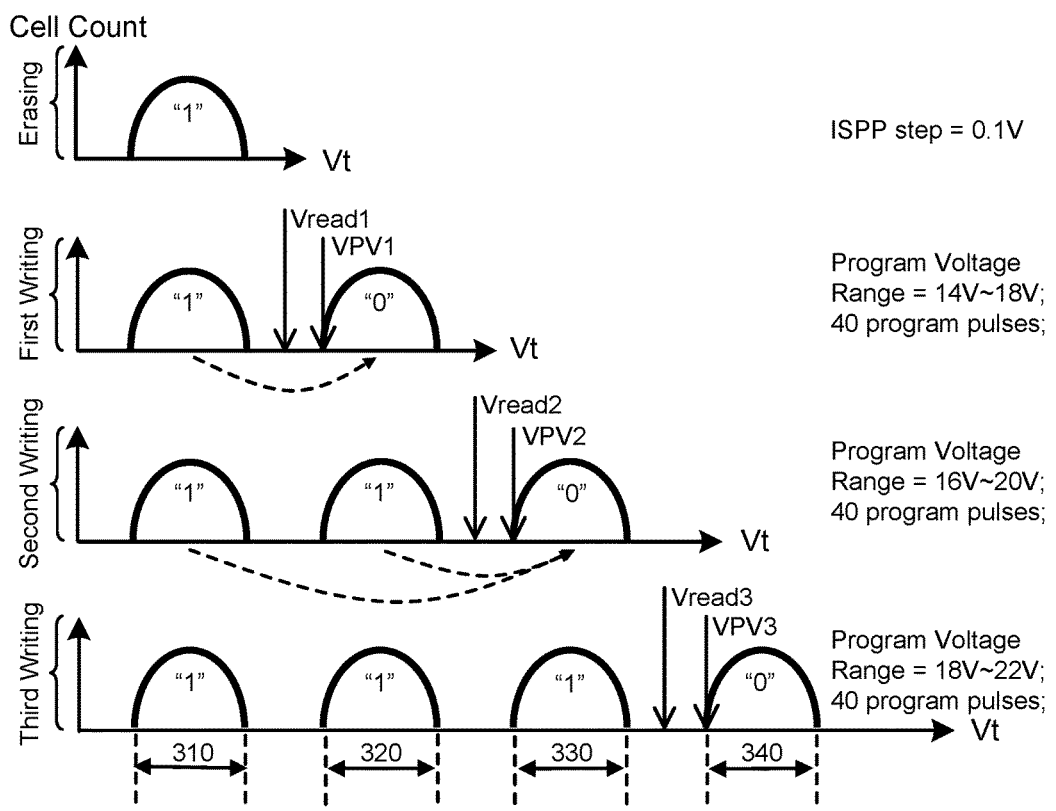
FIG. 4 illustrates a second embodiment of a one-erase, multiple-write programming procedure for programming a single bit per cell memory.

FIG. 4 illustrates a second embodiment of a one-erase, multiple-write programming procedure for programming a single bit per cell memory. The second embodiment can be referred to as an adaptive program voltage range embodiment. This label for the embodiment does not imply any limitation on the process. Description for the first embodiment (FIG. 3, Table 1) is generally applicable to the second embodiment illustrated by FIG. 4. Like elements in FIG. 4 are referred to with like reference numerals in FIG. 3. The second embodiment illustrated by FIG. 4 differs from the first embodiment illustrated by FIG. 3 in that, in the second embodiment, the pulse program sequence is started at a higher program voltage for the second writing operation than for the first writing operation.

In the second embodiment shown in FIG. 4, the pulse program sequence is started at a higher program voltage for the second writing operation than for the first writing operation, and started at a higher program voltage for the third writing operation than for the second writing operation. For instance, the program voltage range for the pulse program sequence can be from 14V to 18V for the first writing operation, from 16V to 20V for the second writing operation, and from 18V to 22V for the third writing operation. Consequently, the pulse program sequence can have a substantially same program voltage range (e.g. 4V), which is narrower than a full program voltage range, such as 8V as shown for the third writing operation in the first embodiment. For instance, given an ISPP step of 0.1V, it takes up to 40 program pulses to set threshold voltages in any one of the ranges of threshold voltages in the first, second and third writing operations. Accordingly, for a given ISPP step, fewer program pulses are required to set threshold voltages in the ranges of threshold voltages for the memory cells, in the second embodiment than in the first embodiment. As a result, the second embodiment with fewer program pulses can therefore shorten program (write) latency and reduce the program disturbance, i.e., especially for pass voltage disturbance. A lower program disturbance may result in a lower BER (bit error rate), and a fixed number of program pulses in the adaptive program voltage can achieve a low variation of program latency.

Figure 5:
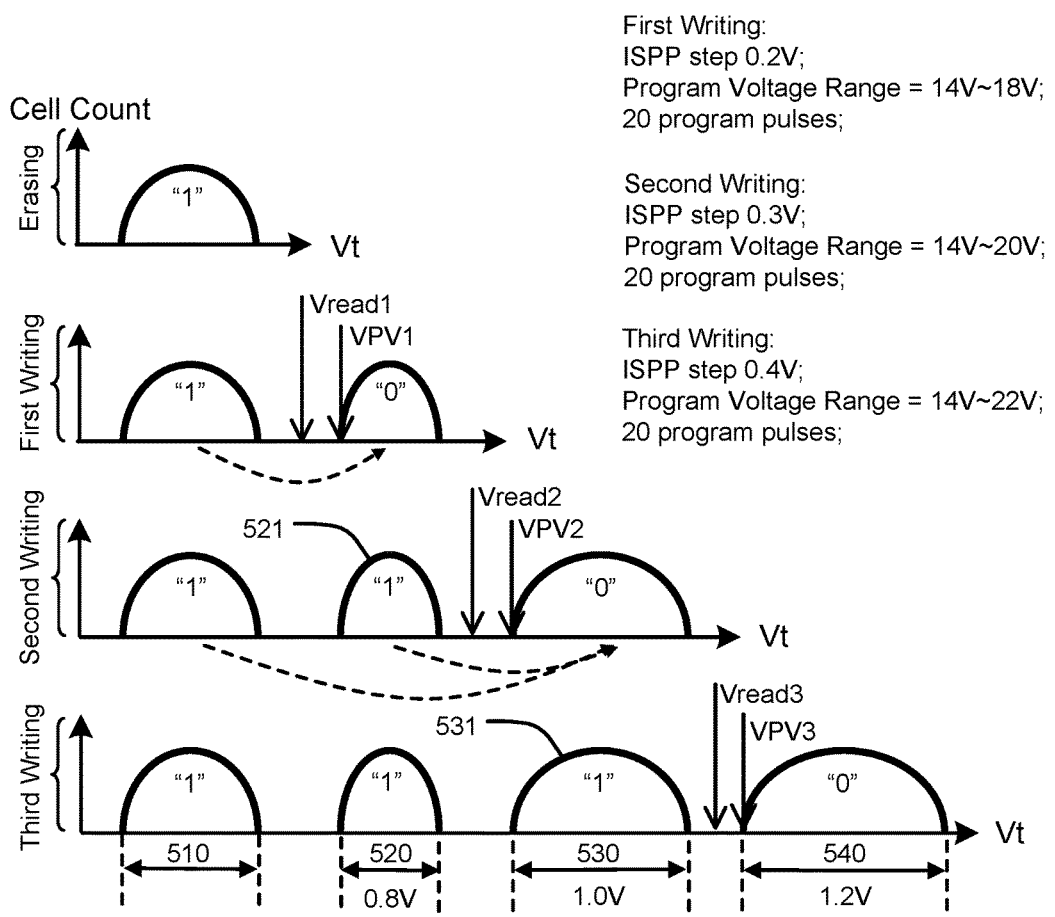
FIG. 5 illustrates a third embodiment of a one-erase, multiple-write programming procedure for programming a single bit per cell memory.

FIG. 5 illustrates a third embodiment of a one-erase, multiple-write programming procedure for programming a single bit per cell memory. The third embodiment can be referred to as a variable threshold voltage range embodiment. This label for the embodiment does not imply any limitation on the process. Description for the first embodiment (FIG. 3, Table 1) is generally applicable to the third embodiment. Like elements in FIG. 5 are referred to with like reference numerals in FIG. 3. The third embodiment illustrated by FIG. 5 differs from the first embodiment illustrated by FIG. 3 in that, in the third embodiment, a larger voltage step is used in the second writing operation than in the first writing operation for incrementally increasing the program voltages of program pulses in the pulse program sequence.

In the third embodiment shown in FIG. 5, a larger voltage step is used in the second writing operation than in the first writing operation for incrementally increasing the program voltages of program pulses in the pulse program sequence. Similarly, a larger voltage step is used in the third writing operation than in the second writing operation for incrementally increasing the program voltages of program pulses in the pulse program sequence. As described herein, the first, second and third writing operations are to set threshold voltages in the second, third and fourth ranges of threshold voltages (e.g. 520, 530, 540), respectively. As shown in the example of FIG. 5, the voltage step is increased from 0.2V for the first writing operation, to 0.3V for the second writing operation, and to 0.4V for the third writing operation.

A range of threshold voltages (e.g. 521) which represents the first logical value ("1") after the second writing operation overlaps with the second range of threshold voltages (e.g. 520). A range of threshold voltages (e.g. 531) which represents the first logical value ("1") after the third writing operation overlaps with the third range of threshold voltages (e.g. 530).

As more writing operations are executed on the memory cells from the first writing operation to subsequent operations, widths of the ranges of threshold voltages for subsequent operations can be increased, because greater widths of the ranges of threshold voltages can reduce the required number of program pulses in the pulse program sequence, and in turn reduce the disturbance for memory cells in low threshold voltage states.

As a result of larger voltage steps in the pulse program sequence, widths of the ranges of threshold voltages for the writing operations can be increased from the first writing operation to subsequent operations. For instance, the third range of threshold voltages (e.g. 530) for the second writing operation has a width (e.g. 1.0V) that is greater than a width (e.g. 0.8V) of the second range of threshold voltages (e.g. 520) for the first writing operation. Similarly, the fourth range of threshold voltages (e.g. 540) for the third writing operation has a width (e.g. 1.2V) that is greater than a width (e.g. 1.0V) of the third range of threshold voltages (e.g. 530).

Greater widths of the ranges of threshold voltages can reduce the required number of program pulses in the pulse program sequence. For instance, if the program voltage range for the pulse program sequence is from 14V to 18V (18V−14V=4V) for the first writing operation, from 14V to 20V (20V−14V=6V) for the second writing operation, and from 14V to 22V (22V−14V=8V) for the third writing operation, and the voltage step is 0.2V, 0.3V and 0.4V for the first, second and third writing operations respectively, then it takes up to 20 program pulses to set threshold voltages in any one of the ranges of threshold voltages in the first, second and third writing operations. For instance, the ISPP sequence can be configured for up to 4V/0.2V=20 program pulses, 6V/0.3V=20 program pulses, and 8V/0.4V=20 program pulses for the first, second and third writing operations respectively.

In comparison, the first, second and third writing operations in the first embodiment (FIG. 3) have the same program voltage ranges (e.g. 14V-18V, 14V-20V, 14V-22V) as the third embodiment (FIG. 5), but need up to 40, 60 and 80 program pulses, respectively.

Accordingly, fewer program pulses are required to set threshold voltages in the ranges of threshold voltages for the memory cells, in the third embodiment than in the first embodiment, and disturbance to the memory cells at low threshold voltage state can be reduced.

Figure 6:
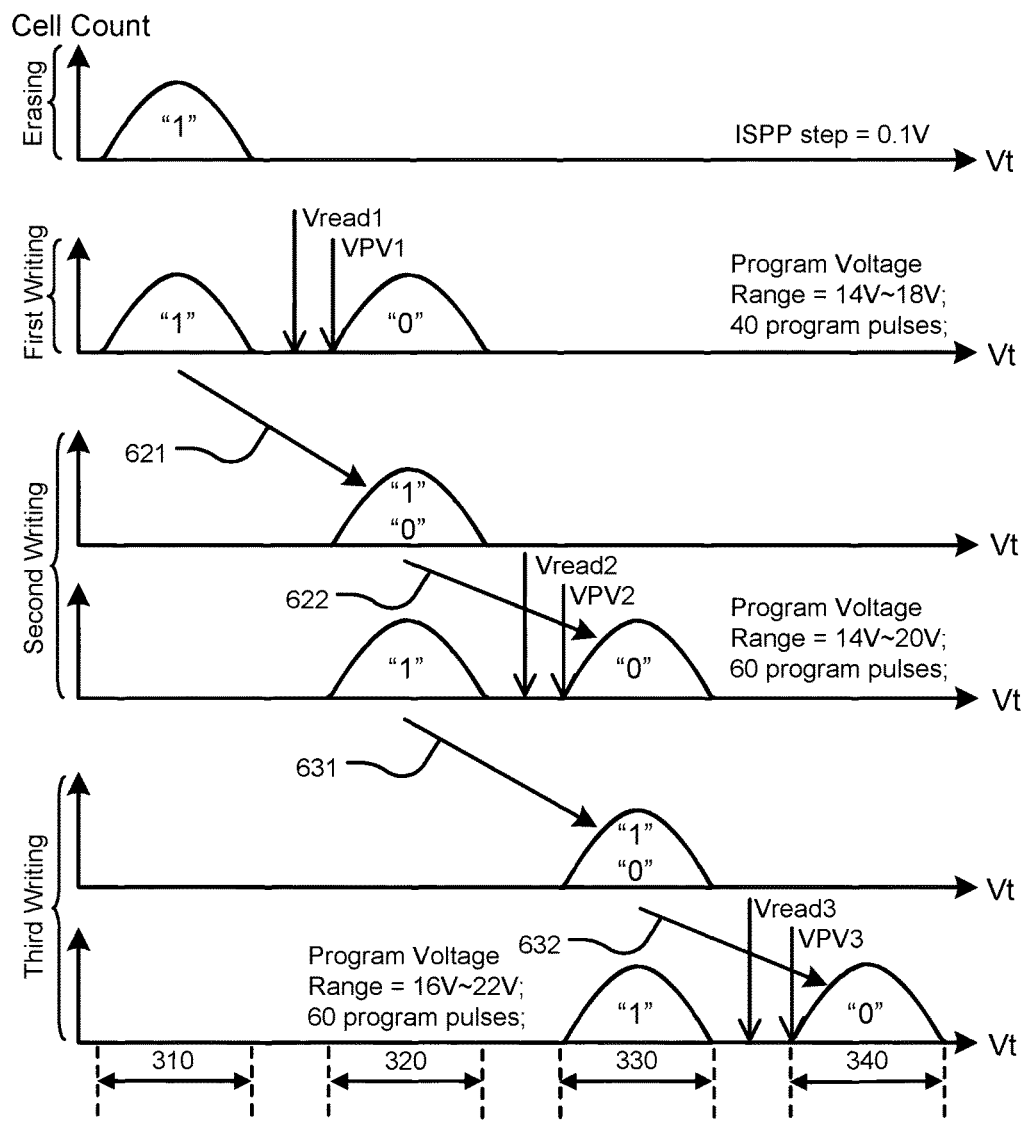
FIG. 6 illustrates a fourth embodiment of a one-erase, multiple-write programming procedure for programming a single bit per cell memory.

FIG. 6 illustrates a fourth embodiment of a one-erase, multiple-write programming procedure for programming a single bit per cell memory. The fourth embodiment can be referred to as a parallel shift embodiment. This label for the embodiment does not imply any limitation on the process. Description for the first embodiment (FIG. 3) is generally applicable to the fourth embodiment. Like elements in FIG. 6 are referred to with like reference numerals in FIG. 3.

The parallel shift embodiment describes first programming memory cells in the group of memory cells having threshold voltages in the first range 310 of threshold voltages to set their threshold voltages in the second range 320 of threshold voltages, and then programming the second selected memory cells in the group to set their threshold voltages in the third range 330 of threshold voltages, where the second range 320 of threshold voltages is higher than the previous verify voltage (e.g. VPV 1) and different than the first range 310 of threshold voltages.

As shown in the example of FIG. 6, the second writing operation includes two stages. The first stage (e.g. 621) is to program memory cells in the group having threshold voltages in the first range 310 of threshold voltages to set their threshold voltages to the second range 320 of threshold voltages. The second stage (e.g. 622), after the first stage, is to program the selected cells to set their threshold voltages in the third range 330 of threshold voltages.

The third writing operation also includes two stages. The first stage (e.g. 631) is to program memory cells in the group having threshold voltages in the second range 320 of threshold voltages to set their threshold voltages to the third range 330 of threshold voltages. The second stage (e.g. 632), after the first stage, is to program the selected cells to set their threshold voltages in the fourth range 340 of threshold voltages.

Consequently, after the first writing operation, the first range 310 of threshold voltages represents the first logical value (e.g. "1"), and the second range 320 of threshold voltages represents the second logical value (e.g. "0"). After the second writing operation, the second range 320 of threshold voltages represents the first logical value (e.g. "1"), and the third range 330 of threshold voltages represents the second logical value (e.g. "0"). After the third writing operation, the third range 330 of threshold voltages represents the first logical value (e.g. "1"), and the fourth range 340 of threshold voltages represents the second logical value (e.g. "0"). The second range of threshold voltages after the second writing operation may not be equal to the second range of threshold voltages after the first writing operation. But rather the second ranges of threshold voltages after the first and second writing operations are roughly in a same region on the threshold voltage Vt axis. The actual extent of the second ranges of threshold voltages after the first and second writing operations will likely differ.

Table 2 illustrates the parallel shift embodiment, in reference to FIG. 6, and using 5 memory cells (Cells 1-5) as an example.

TABLE 2

|  | Cell 1 | Cell 2 | Cell 3 | Cell 4 | Cell 5 |
| --- | --- | --- | --- | --- | --- |
| Erase | Erased to "1" (310) | Erased to "1" (310) | Erased to "1" (310) | Erased to "1" (310) | Erased to "1" (310) |
| 1$^{st}$ Writing | Remain at "1" (310) | Write "0" (320) | Write "0" (320) | Remain at "1" (310) | Remain at "1" (310) |
| Stage 1, 2$^{nd}$ Writing | Write to (320) | Remain at "1" (320) | Remain at "1" (320) | Write to (320) | Write to (320) |
| Stage 2, 2$^{nd}$ Writing | Remain at "1" (320) | Remain at "1" (320) | Write "0" (330) | Write "0" (330) | Remain at "1" (320) |
| Stage 1, 3$^{rd}$ Writing | Write to (330) | Write to (330) | Remain at "1" (330) | Remain at "1" (330) | Write to (330) |
| Stage 1, 3$^{rd}$ Writing | Remain at "1" (330) | Remain at "1" (330) | Remain at "1" (330) | Write "0" (340) | Write "0" (340) |

As shown in the example of Table 2, after an erase operation, all 5 memory cells are set to threshold voltages in a first range 310 of threshold voltages (FIG. 6) representing a first logical value (e.g. "1").

After a first writing operation to write the logic value "0" to memory cells 2 and 3, memory cells 2 and 3 are set to threshold voltages in a second range 320 of threshold voltages (FIG. 6) representing a second logical value (e.g. "0"). Memory cells 1, 4 and 5 remain in the first range of threshold voltages representing the first logical value (e.g. "1").

A second writing operation to write the logic value "0" to memory cells 3 and 4 includes Stage 1 and Stage 2. After Stage 1, memory cells 1, 4 and 5 are set to threshold voltages in the second range 320 of threshold voltages (FIG. 6) representing the first logical value (e.g. "1"). After Stage 2, memory cells 3 and 4 are set to threshold voltages in a third range 330 of threshold voltages (FIG. 6) representing the second logical value (e.g. "0"). Memory cells 1, 2 and 5 remain in the second range of threshold voltages representing the first logical value (e.g. "1").

A third writing operation to write the logic value "0" to memory cells 4 and 5 includes Stage 1 and Stage 2. After Stage 1, memory cells 1, 2 and 5 are set to threshold voltages in the third range 330 of threshold voltages representing the first logical value (e.g. "1").

After Stage 2, memory cells 4 and 5 are set to threshold voltages in a fourth range 340 of threshold voltages (FIG. 6) representing the second logical value (e.g. "0"). Memory cells 1, 2 and 3 remain in the third range of threshold voltages representing the first logical value (e.g. "1").

In the parallel shift embodiment, after each writing operation, conceptually only one range of threshold voltages represents the first logical value (e.g. "1"), and only one other range of threshold voltages represents the second logical value (e.g. "0"). For instance, after the first writing operation, only the first range 310 of threshold voltages represents the first logical value (e.g. "1"), and only the second range 320 of threshold voltages represents the second logical value (e.g. "0"). After the second writing operation, only the second range 320 of threshold voltages represents the first logical value (e.g. "1"), and only the third range 330 of threshold voltages represents the second logical value (e.g. "0"). After the third writing operation, only the third range 330 of threshold voltages represents the first logical value (e.g. "1"), and only the fourth range 340 of threshold voltages represents the second logical value (e.g. "0").

In comparison, in the first, second and third embodiments, after each writing operation, conceptually more than one range (e.g. 310, 320, 330) of threshold voltages may represent the first logical value (e.g. "1"), while another range of threshold voltages represents the second logical value (e.g. "0"). More specifically, in the first, second and third embodiments, the range of threshold voltages representing the first logical value may encompass the ranges 310, 320 and 330 of threshold voltages shown in FIGS. 3 and 4, and may encompass the ranges 510, 520 and 530 shown in FIG. 5.

The parallel shift embodiment can be implemented using two page buffers for use in the program and program verify steps described herein. A data set can be stored in both page buffers for programming the group of memory cells. Each memory cell in the group has a plurality of ranges of threshold voltages. The two page buffers can be sub-circuits in the program buffer in block 80 shown in FIG. 1. The data set indicates one of the first logical value ("1") and the second logical value ("0") for each memory cell in the group.

The first step in a writing operation, such as the second or third writing operation described above, can program the memory cells in the plurality of memory cells indicated for the first data value ("1") by the data set stored in the first page buffer. The second step in a writing operation can program the memory cells in the plurality of memory cells indicated for the second data value ("0") by the data set stored in the second page buffer.

Figure 7:
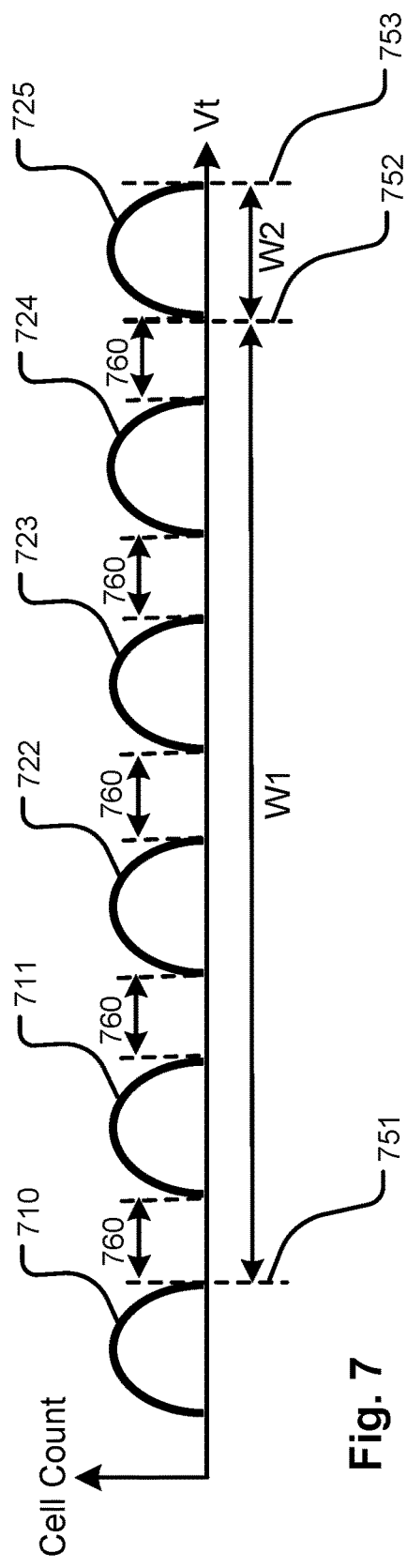
FIG. 7 illustrates derivation of a threshold number for writing a group of memory cells after one erase operation.

FIG. 7 illustrates derivation of a threshold number for writing a group of memory cells after one erase operation, where the memory cells are capable of programming to a wide range of threshold voltages. The number of times the write can occur depends on the width of the range, and the number of divisions of the ranges that can be safely programmed and erased.

As described herein, after a number of writing operations including the first and second writing operations reaches a threshold number for writing the group of memory cells, the group of memory cells can be erased. The group of memory cells has a plurality of ranges of threshold voltages including a lowest range of threshold voltages and a highest range of threshold voltages. The threshold number can be derived from:

the threshold number=(minimum voltage in the highest range−maximum voltage in the lowest range)/(an average range of the ranges in the plurality of ranges+a margin between two adjacent ranges in the plurality of ranges).

As shown in FIG. 7, a plurality of ranges of threshold voltages (e.g. 710-725) includes a lowest range of threshold voltages (e.g. 710) having a maximum voltage (e.g. 751) and a highest range of threshold voltages (e.g. 725) having a minimum voltage (e.g. 752). W1 illustrates (minimum voltage in the highest range—maximum voltage in the lowest range). W2 illustrates an average range of the ranges in the plurality of ranges. A margin is between two adjacent ranges in the plurality of ranges (e.g. 760).

As an example, for "minimum voltage in the highest range"=4V, "maximum voltage in the lowest range"=−1V, margin=0.2V, "average range"=0.8V, the threshold number can be derived as: (4V−(−1V))/(0.8V+0.2V)=5.

Figure 8:
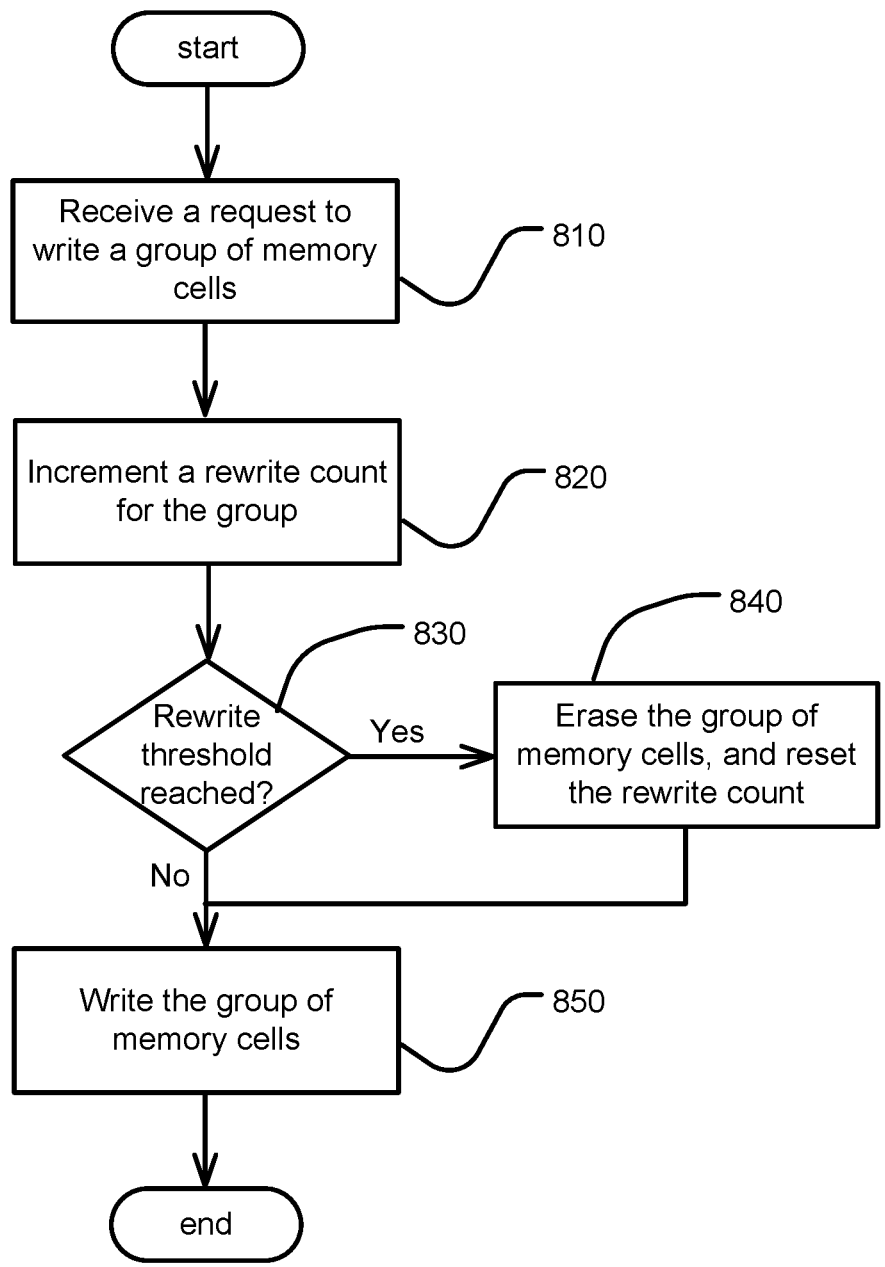
FIG. 8 is a simplified flowchart of a one-erase, multiple-write procedure according to one embodiment.

FIG. 8 is a simplified flowchart of a one-erase, multiple-write procedure according to one embodiment. Conventionally, when an integrated circuit flash memory device receives a request from a file system to write a data set to a group of memory cells, the integrated circuit first erases all memory cells in the group of memory cells and then writes the data set to erased memory cells in the group. A group of memory cells can be a page of memory cells or a block of memory cells. In a 3D NAND-flash memory structure, the memory includes a plurality of pages of memory cells, and a page can be defined for the purpose of this description as the memory cells that can be coupled in parallel to a set of N bit lines and are selected by a set of M word lines. A page can be defined in this structure as including the memory cells in one stack of semiconductor strips, selected by a single SSL switch, where each strip is coupled to a corresponding bit line via the stairstep pads. The definition of a page and the decoding applied to access a page can vary as suits a particular memory architecture. The memory structure can include a page program buffer to which the set of N bit lines is coupled in parallel, for use in the program and program verify steps described herein. In one example, there can be four planes of memory cells, which provide for four bit lines per page. In other examples there can be other numbers of planes. For instance, there can be eight planes, with eight even stacks and eight odd stacks, making a memory block including a total of 16 pages of eight bit lines per page.

In one embodiment of the present technology, the one-erase, multiple-write procedure involves determining whether to execute an erase operation on a group of memory cells before writing the data set to the group of memory cells, in response to a request to write the group of memory cells. The group of memory cells is erased once and written multiple times before another erase operation is executed. As shown in the example of FIG. 8, at Step 810, a request to write a data set to the group of memory cells is received by an integrated circuit (e.g. 100, FIG. 1) from for example a file system. At Step 820, a rewrite count for the group of memory cells is incremented, in response to the request.

The integrated circuit (e.g. 100, FIG. 1) can have multiple groups of memory cells, and each of the multiple groups can have its own rewrite count. The rewrite count for each group of memory cells in the integrated circuit can be saved and updated on-chip or in the integrated circuit, such as in the sensing state parameter table 10A in the integrated circuit memory device 100 (FIG. 1). Alternatively, the rewrite count for each group of memory cells can be saved and updated at a location off-chip or external to the integrated circuit 100, such as in the Memory Technology Device Layer 930 (FIG. 9) and/or in the file system 901 (FIG. 9).

At Step 830, it is determined whether the rewrite count reaches a rewrite threshold for the group of memory cells. If the rewrite count reaches the rewrite threshold for the group of memory cells (Step 830, Yes), then at Step 840, the group of memory cells is erased, the rewrite count for the group of memory cells is reset, and subsequently at Step 850, the group of memory cells is written with the data set from the file system. If the rewrite count is below the rewrite threshold (Step 830, No), then at Step 850, the group of memory cells is written with the data set from the file system, without erasing the group of memory cells and without resetting the rewrite count for the group of memory cells.

In an alternative embodiment, when the rewrite count reaches the rewrite threshold for the group of memory cells (Step 830, Yes), the data set indicated by the request can be written to another group of memory cells that has a lower rewrite count than the group of memory cells indicated by the request, and the rewrite count for the other group of memory cells can be incremented. The other group of memory cells can be in a same block of memory cells as, or a different block of memory cells than, the group of memory cells indicated by the request. In this alternative embodiment, the group of memory cells is not immediately erased and the rewrite count for the group of memory cells is not immediately reset. A block of memory cells can be erased and rewrite counts for groups of memory cells in the block can be reset, when rewrite counts for more than one or all groups of memory cells in the block have reached the rewrite threshold. As a result, the number of erase cycles can be reduced and the endurance of the memory can be improved.

FIG. 9 is a block diagram of an example memory management system 900, including a file system 901, flash translation layer 920, memory technology device layer 930, and flash memory chips 940. The file system 901 is coupled to the flash translation layer 920. The flash translation layer 920 includes address translator 921, garbage collector 923 and wear leveler 925. The flash translation layer 920 is coupled to the memory technology device layer 930. The memory technology device layer 930 is a hardware abstraction layer for handling primitive operations, e.g., read, program and erase of flash memory chips 940. The memory technology device layer 930 includes an erase management module 931, which includes a rewritable block table 932. The erase management module 931 is coupled to read function 933, program function 935 and erase function 937 in the memory technology device layer 930. The memory technology device layer 930 is coupled to flash memory chips 940. The memory technology device layer 930 makes it possible for the flash translation layer 920 to work on top of the flash memory chips 940 without any modification to the flash translation layer 920.

The rewritable block table 932 is a data structure that maintains a rewrite count for a group of memory cells in each of the flash memory chips 940. A flash memory chip can include groups of memory cells, where a group of memory cells can be a page of memory cells or a block of memory cells.

Assuming that a group of memory cells can be rewritten eight times after one erase operation, only three bits are required for maintaining a rewrite count for a group, and therefore the memory overhead is very light. As shown in the example of FIG. 9, after one erase operation and before any writing operation on group 909, the rewrite count for group 909 is 0, and group 909 is ready for data writing (referred to as first writing as shown in FIGS. 3-6). Similarly, group 910 has been rewritten seven times, which means that this group has been rewritten seven times after the last physical erase, and group 911 has been rewritten three times, which means that this group has been written three times after the last physical erase.

The memory management system 900 intercepts all operations from the upper layer, i.e., the flash translation layer 920 (FTL), and modifies read/write/erase commands to the underlying flash memory chips 940 based on the information maintained in the rewritable block table 932. For example, if a command received from FTL is an erase command to group 910, the system 900 will issue a physical erase command to group 910 and reset its rewrite count to 0. This is because group 910 has reached a rewrite threshold, e.g., 8. Instead, if an erase command is issued to group 909 from the flash translation layer 920, the system 900 will not issue a physical erase command to group 909 in a flash memory chip and only increase the rewrite count for group 909 from 0 to 1, referred to as virtual erase. Thus, as a larger rewrite threshold can be supported, more erase operations can be removed, so that the lifetime of the flash memory chips can be extended and the performance of the flash memory chips can be improved.

Furthermore, a sensing state parameter for the group of memory cells can be stored in a controller controlling and external to the flash memory chips 940, such as the memory technology device layer 930, to indicate a read voltage at which to sense a cell logical value for the memory cells in the group. Alternatively, a sensing state parameter for the group of memory cells can be stored in a host system, such as the file system 901, to indicate a read voltage at which to sense a cell logical value for the memory cells in the group.

Embodiments of the programming operations have been described with reference to a 3D NAND-flash memory array structure used with variants of the one-erase, multiple-write programming technology. The 3D NAND-flash memory array structure is described in commonly owned U.S. Pat. No. 8,503,213 issued 6 Aug. 2013, entitled "Memory Architecture of 3D Array With Alternating Memory String Orientation and String Select Structures," which is hereby incorporated by reference as if fully set forth herein. The 3D NAND-flash memory array structure includes stacked memory structures resulting in the array having a plurality of memory cells disposed in a dense configuration. The operations can be tuned for a variety of 2-D and 3-D memory architectures, and to date memory architectures.

Also, embodiments of the programming operations have been described with reference to flash memory. The operations can be tuned for other memory cell types as well.

While the present invention is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the invention and the scope of the following claims.

The invention claimed is:

1. A method of operating a single bit per cell memory, comprising:
    erasing a group of memory cells establishing a first logical value in the memory cells of the group by setting threshold voltages in a first range of threshold voltages;
    first writing, after said erasing, including programming first selected memory cells in the group to establish a second logical value by setting threshold voltages in a second range of threshold voltages, the second range of threshold voltages different than the first range of threshold voltages, and saving a sensing state parameter to indicate a first read voltage;
    second writing, after said first writing, including programming second selected memory cells in the group to establish the second logical value by setting threshold voltages in a third range of threshold voltages, the third range of threshold voltages different than the first and second ranges of threshold voltages, and saving the sensing state parameter to indicate a second read voltage;
    after a number of writings including said first writing and said second writing reaches a threshold number for writing the group of memory cells, erasing the group of memory cells; and
    applying program pulses and respective program verify pulses following the program pulses in a pulse program sequence which incrementally increases program pulse voltages of the program pulses for programming the memory cells in the group, wherein at least one of a starting program pulse voltage magnitude in the pulse program sequence and a voltage step in the pulse program sequence is different for the first writing than for the second writing.

2. The method of claim 1, including after said erasing, setting the sensing state parameter to indicate the first read voltage to sense the cell logical value.

3. The method of claim 1, wherein a range of threshold voltages which represents the first logical value after said second writing overlaps with the second range of threshold voltages.

4. The method of claim 1, wherein:
    said first writing including programming using a first program verify voltage between the first range and the second range of threshold voltages and higher than the first read voltage to set threshold voltages in the second range of threshold voltages; and
    said second writing including programming using a second program verify voltage between the second range and the third range of threshold voltages and higher than the second read voltage to set threshold voltages in the third range of threshold voltages.

5. The method of claim 4, wherein the second program verify voltage has a higher voltage magnitude than the first program verify voltage.

6. The method of claim 1, comprising:
    third writing, after said second writing, including programming third selected memory cells in the group to establish the second logical value by setting threshold voltages in a fourth range of threshold voltages, the fourth range of threshold voltages different than the first, second and third ranges of threshold voltages, and saving the sensing state parameter to indicate a third read voltage.

7. The method of claim 6, wherein a range of threshold voltages which represents the first logical value overlaps with the third range of threshold voltages after said third writing.

8. The method of claim 1, wherein the pulse program sequence for the second writing has more pulse steps than the pulse program sequence for the first writing.

9. The method of claim 1, comprising:
    starting the pulse program sequence at a higher program pulse voltage for said second writing than for said first writing.

10. The method of claim 1, comprising:
    using a larger voltage step in said second writing than in said first writing for incrementally increasing the program pulse voltages of program pulses in the pulse program sequence.

11. The method of claim 1, wherein the third range of threshold voltages for said second writing has a width different than that of the second range of threshold voltages for said first writing.

12. The method of claim 1, wherein a range of threshold voltages which represents the first logical value after said second writing has a width greater than the first range of threshold voltages.

13. The method of claim 1, said second writing comprising:
programming memory cells in the group having threshold voltages in the first range of threshold voltages to set their threshold voltages in the second range of threshold voltages, and then programming the second selected cells to set their threshold voltages in the third range of threshold voltages.

14. The method of claim 1, comprising:
reading the memory cells in the group of memory cells including determining a read voltage in response to the saved sensing state parameter for the group of memory cells.

15. A method of claim 1, wherein the sensing state parameter for the group includes a rewrite count, the method comprising:
incrementing the rewrite count for the group of memory cells, in response to a request to write the group of memory cells;
if the rewrite count reaches a rewrite threshold for the group of memory cells, erasing the group of memory cells, resetting the rewrite count for the group of memory cells, and subsequently writing the group of memory cells; and
if the rewrite count is below the rewrite threshold, writing the group of memory cells, without erasing the group of memory cells and without resetting the rewrite count for the group of memory cells.

16. The method of claim 1, comprising:
saving the sensing state parameter for the group of memory cells in a sensing state parameter table in the memory to indicate a read voltage at which to sense a cell logical value for the memory cells in the group.

17. The method of claim 1, comprising:
saving the sensing state parameter for the group of memory cells in a sensing state parameter table in a controller controlling and external to the memory to indicate a read voltage at which to sense a cell logical value for the memory cells in the group.

18. The method of claim 1, comprising:
saving the sensing state parameter for the group of memory cells in a sensing state parameter table in a host system coupled to a controller controlling and external to the memory to indicate a read voltage at which to sense a cell logical value for the memory cells in the group.

19. A memory device comprising:
a group of single bit per cell memory cells;
a controller coupled to the group of single bit per cell memory cells including logic to establish a first logical value of the single bit in the memory cells by an erase operation setting threshold voltages in a first range of threshold voltages;
logic to set first and second logical values on the single bit by a first write operation, after executing the erase operation, including the first write operation including programming first selected memory cells in the group to establish a second logical value by setting threshold voltages in a second range of threshold voltages, the second range of threshold voltages different than the first range of threshold voltages, and saving a sensing state parameter to indicate a first read voltage;
logic to set first and second logical values on the single bit by a second write operation, after executing the first write operation, the second write operation including programming second selected memory cells in the group to establish the second logical value by setting threshold voltages in a third range of threshold voltages, the third range of threshold voltages different than the first and second ranges of threshold voltages, and saving the sensing state parameter to indicate a second read voltage;
logic to execute the erase operation after a number of times that the first and second write operations are executed reaches a threshold number for writing the group of memory cells;
logic to execute a read operation including applying a selected one of the first and second read voltages; and
logic to apply program pulses and respective program verify pulses following the program pulses in a pulse program sequence which incrementally increases program pulse voltages of the program pulses for programming the memory cells in the group, wherein at least one of a starting program pulse voltage magnitude in the pulse program sequence and a voltage step in the pulse program sequence is different for the first writing than for the second writing.

* * * * *